US012635540B2

(12) United States Patent
Paital et al.

(10) Patent No.: US 12,635,540 B2
(45) Date of Patent: May 19, 2026

(54) PACKAGING ARCHITECTURE WITH CAVITIES FOR EMBEDDED INTERCONNECT BRIDGES

(71) Applicant: Intel Corporation, Santa Clara, CA (US)

(72) Inventors: Sameer Paital, Chandler, AZ (US); Gang Duan, Chandler, AZ (US); Srinivas V. Pietambaram, Chandler, AZ (US); Kristof Kuwawi Darmawikarta, Chandler, AZ (US); Tchefor Ndukum, Chandler, AZ (US); Vejayakumaran Padavettan, Kulim (MY); Pooja Wadhwa, Chandler, AZ (US); Brandon C. Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 17/847,407

(22) Filed: Jun. 23, 2022

(65) Prior Publication Data

US 2023/0420378 A1 Dec. 28, 2023

(51) Int. Cl.
| | |
|---|---|
| *H01L 23/538* | (2006.01) |
| *H01L 21/48* | (2006.01) |
| *H01L 23/00* | (2006.01) |
| *H01L 25/065* | (2023.01) |

(52) U.S. Cl.
CPC ...... *H01L 23/5386* (2013.01); *H01L 21/4857* (2013.01); *H01L 23/5381* (2013.01); *H01L 23/5383* (2013.01); *H01L 24/16* (2013.01); *H01L 25/0655* (2013.01); *H01L 2224/16227* (2013.01)

(58) Field of Classification Search
CPC ............ H01L 23/5386; H01L 23/5383; H01L 23/5385; H01L 23/5381; H01L 21/4857; H01L 2224/48451; H01L 2224/48453; H01L 2224/16227; H01L 2224/1703; H01L 2224/02205; H01L 2224/02; H01L 2224/11526; H01L 2224/1605; H01L 25/0655; H01L 24/16
See application file for complete search history.

(56) References Cited

U.S. PATENT DOCUMENTS

| | | | | |
|---|---|---|---|---|
| 2020/0411443 | A1* | 12/2020 | Guo ........................ | H01L 24/09 |
| 2022/0238445 | A1* | 7/2022 | Olson ................. | H01L 23/5386 |
| 2023/0088392 | A1* | 3/2023 | Pietambaram ...... | H01L 21/4857 257/773 |
| 2023/0209800 | A1* | 6/2023 | Sharma ................... | G11C 11/41 257/776 |

* cited by examiner

*Primary Examiner* — Lawrence C Tynes, Jr.
(74) *Attorney, Agent, or Firm* — Akona IP PC

(57) ABSTRACT

Embodiments of a microelectronic assembly comprise an interposer comprising a dielectric material and a pad of conductive material having at least one of a ceramic liner and fin structures; at least two integrated circuit (IC) dies coupled to the interposer; and a bridge die in the interposer conductively coupled to the at least two IC dies. The bridge die has a first face and an opposing second face, the first face of the bridge die is proximate to the at least two IC dies, and the second face of the bridge die is in contact with the pad.

20 Claims, 7 Drawing Sheets

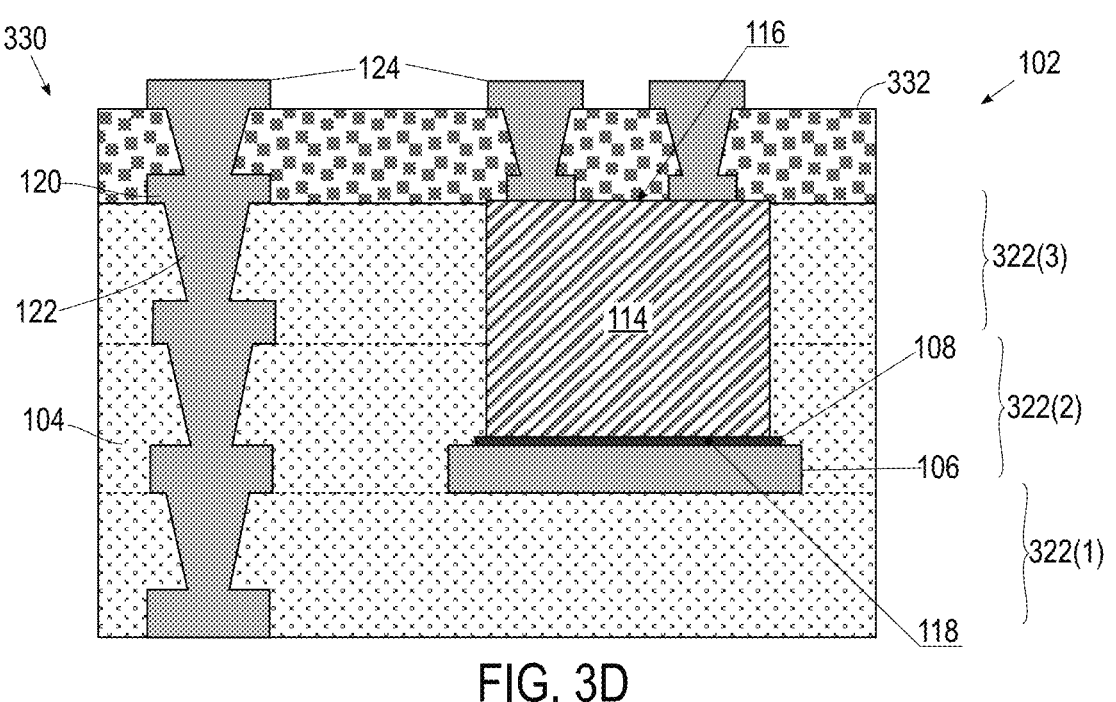
FIG. 3D
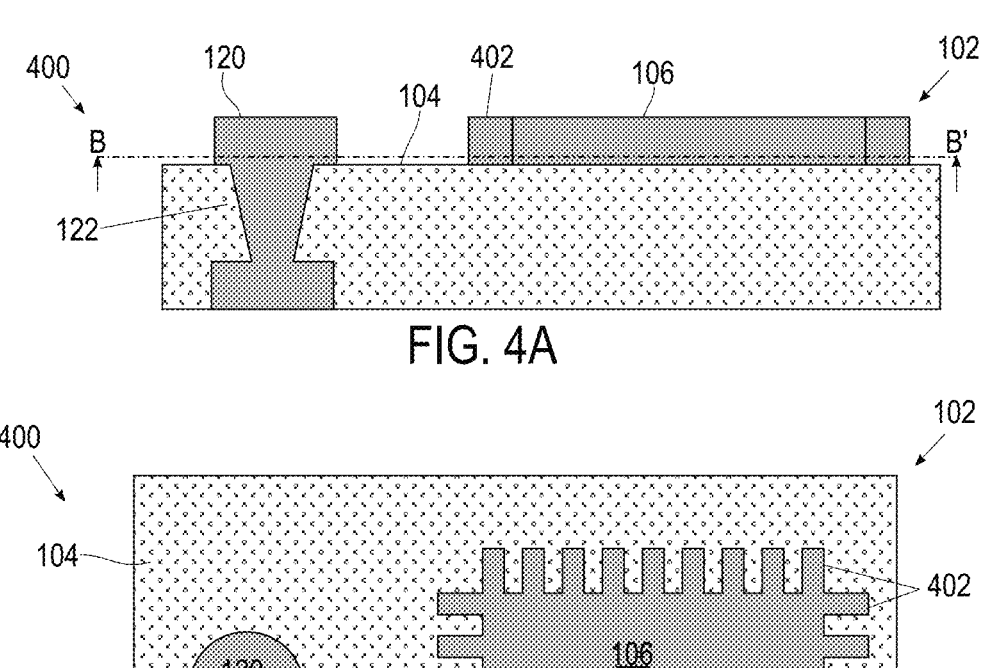
FIG. 4A
FIG. 4B

PACKAGING ARCHITECTURE WITH CAVITIES FOR EMBEDDED INTERCONNECT BRIDGES

TECHNICAL FIELD

The present disclosure relates to techniques, methods, and apparatus directed to a packaging architecture with cavities for heterogeneous embedded interconnect bridges.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3D are schematic cross-sectional views of various stages of manufacture of an example microelectronic assembly according to some embodiments of the present disclosure.

FIGS. 4A-4D are schematic cross-sectional views of various stages of manufacture of another example microelectronic assembly according to some embodiments of the present disclosure.

DETAILED DESCRIPTION

Overview

Figures 1A, 1B, 2:
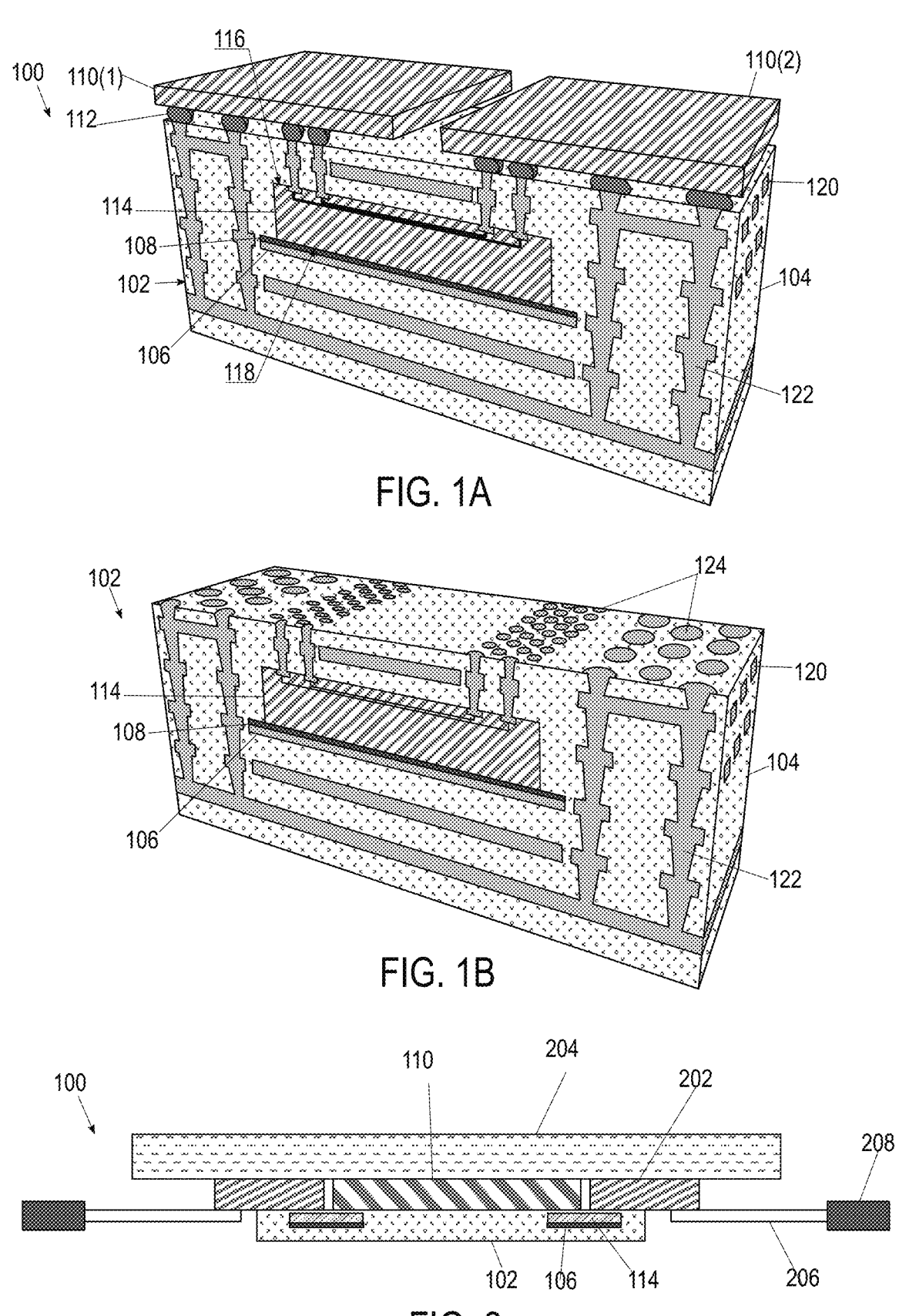
FIG. 1A is a schematic perspective view of an example microelectronic assembly according to some embodiments of the present disclosure.
FIG. 1B is a schematic perspective view of certain portions of the example microelectronic assembly of FIG. 1A.
FIG. 2 is a schematic cross-sectional view of another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Many computing schemes such as artificial intelligence, machine learning and other emerging applications require more computing horsepower with higher performance, extremely low latency, and smaller form factors than traditional computing applications. Such demands foster the development of a 2.5-dimensional (2.5D) or 3-dimensional (3D) multi-chip package technology. Conventionally, 2.5-D package architecture is achieved by utilizing an IC die or silicon interposer as a bridge die to couple two adjacent IC dies on top of the bridge die, for example, to achieve higher aggregated data bandwidth, low latency, less interconnect loss, and hence less power consumption. The two IC dies being coupled may comprise circuits of different functionalities such as application specific integrated circuits (ASIC), radio frequency (RF) circuits, and memory circuits. The interposer typically has through-silicon vias (TSV) to enable electrical connectivity of the top IC dies with a package substrate underneath.

In another technique, instead of using a large silicon interposer, a small bridge die with multiple routing layers may be embedded in an organic substrate to achieve coupling between two other IC dies. One of the ways to enable such a package architecture is to embed the bridge die within a cavity in the organic substrate, the cavity being made by a laser skiving process. Laser skiving is a selective ablation process using a laser, such as a carbon dioxide ($CO_2$) laser, that can, in theory, remove one material without affecting an underlying material. In general, laser skiving is used extensively in printed circuit board (PCB) manufacturing to make cavities for various applications. One laser skiving technique involves removing one thin layer of the dielectric material of the PCB at a time without cutting through the material until a desired depth of the cavity is reached. Such a method can be prohibitively time consuming and may not be applicable in situations where the dielectric material is not homogeneous, for example, mold compound with fillers.

In another technique, skiving depth is controlled by the presence of a dissimilar material, such as metal, that had different energy absorption characteristics than the material being ablated. For example, when used in an organic package substrate having Ajinomoto Buildup Film (ABF) as the dielectric material, the laser skiving process involves using the $CO_2$ laser beam with overlapping pulses to raster along the dimension of the cavity, removing the ABF material in the process while a copper pad at the bottom of the cavity acts as a laser etch stop. Although various laser skiving parameters (e.g., laser pulse energy, laser pulse overlapping ratio, number of pulses etc.) and substrate parameters (e.g., electroless copper to ABF adhesion, copper pad thickness, ABF thickness above copper pad, etc.) may be adjusted to prevent damage to the underlying copper pad, in practice, damage may be inevitable due to various factors, such as the behavior of copper under the focused heat of the laser, strength of the laser necessary to generate the cavity, number of passes needed to create the cavity, time available to generate the cavity, cavity depth, etc. In typical applications, the damage can include delamination of the copper pad, and breakage of the pad. A technique to overcome the problem is to use multiple short pulses or lower energy pulses to be delivered in cycle mode to form the cavity. Multiple short or lower energy pulses in cycle mode provides a delay time between pulses, removing the ABF in a step-by-step progressive manner without focusing excessive heat in a short duration on the copper pad. However, this technique decreases throughput and also requires a narrower process window than is desirable.

Accordingly, embodiments of the present disclosure provide a microelectronic assembly comprising: an interposer comprising a dielectric material and a pad of conductive material having at least one of a ceramic liner and fin structures; at least two IC dies coupled to the interposer; and a bridge die in the interposer conductively coupled to the at least two IC dies, wherein: the bridge die has a first face and an opposing second face, the first face of the bridge die is proximate to the at least two IC dies, and the second face of the bridge die is in contact with the pad. In various embodiments, the ceramic liner or the fin structures may be configured to prevent damage to the pad from laser skiving.

Embodiments of the microelectronic assembly can provide a means for a reliable and wide process window in generating the cavity in the organic dielectric material having the underlying copper pad using the $CO_2$ laser in the laser skiving process. In some embodiments, the ceramic liner comprises a thin, hard ceramic film such as silicon nitride, tantalum nitride (and/or other materials as appropriate) that is resistant to laser ablation and which may be sputtered on the copper pads as to coat it. The hard ceramic film may withstand higher laser fluence and minimize laser induced thermal damage on the copper pad. In some other embodiments, one or more fin structures may be formed around the copper pad that can act as a conductor of heat from the laser skiving process, thereby minimizing thermal accumulation on the pad, and also serving to anchor the pad into the surrounding dielectric material to prevent delamination. Using such techniques, a high-power laser cavity skiving process may be enabled using a single shot laser to form the cavity, thereby improving throughput and yield without damaging the underlying copper pad.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as ABF, polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/ materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of an example microelectronic assembly 100 according to some embodiments of the present disclosure. Microelectronic assembly 100 comprises, in the embodiment shown, an interposer 102 comprising a dielectric material 104 and a pad 106 having a ceramic liner 108. In various embodiments, dielectric material 104 comprises an organic dielectric material, such as mold compound, polyimide, etc. including various fillers based on particular needs. In some embodiments, dielectric material 104 may comprise a dry film material, such as ABF that may not be photo imageable. Pad 106 comprises a conductive material, such as copper, in contact with ceramic liner 108. Any suitable conductive material typically used in interposers and/or package substrates may be used for pad 106 within the broad scope of the embodiments. In various embodiments, ceramic liner 108 comprises any hard insulative material resistant to laser ablation. Examples of such materials include silicon nitride ($Si_3N_4$), tantalum nitride (TaN), titanium oxide ($TiO_2$), titanium carbide (TiC), and titanium diboride ($TiB_2$).

Microelectronic assembly 100 further comprises IC dies 110 (e.g., 110(1), 110(2)) coupled to interposer 102 by FLIs 112. IC dies 110 may be of any suitable functionality, including compute, processor, memory, etc. without departing from the broad scope of the embodiments disclosed herein. A bridge die 114 embedded in interposer 102 is conductively coupled to IC dies 110. In various embodiments, one or more conductive pathways through bridge die 114 and FLIs 112 conductively couple IC dies 110 with each other. In some embodiments, bridge die 114 may not comprise any active components such as transistors and diodes; in such embodiments, bridge die 114 may comprise only metallization stacks over a semiconductor substrate, the metallization stacks comprising various conductive traces and vias in an interlayer dielectric (ILD) material different from dielectric material 104 of interposer 102. The conductive traces may provide suitable structures for conductive pathways between IC dies 110. Spacing between adjacent conductive traces and/or interconnects in bridge die 114 may be in the order of a few micrometers (e.g., less than 5 micrometers).

Bridge die 114 has a first surface 116 proximate to IC dies 110 and an opposing second surface 118 in contact with pad 106. In various embodiments, pad 106 has a footprint that is larger than another footprint of bridge die 114. Interposer 102 further comprises conductive traces 120 and vias 122 in dielectric material 104. Conductive traces 120 may include landing pads of vias 122 in various layers of dielectric material 104.

In some embodiments (not shown), bridge die 114 may be embedded in a cavity structure such that there is a gap between the walls of the cavity and bridge die 114. Even in structures in which the gap is absent, at least one method of fabricating interposer 102 with bridge die 114 embedded therein involves creating a cavity and placing bridge die 114 therein. In embodiments in which dielectric material 104 is not photo imageable, such a cavity may be made in dielectric material 104 by laser skiving process. As described in a previous section, laser skiving is a selective ablation process that can, in theory, remove one material without affecting an underlying material. Although various laser skiving parameters may be adjusted to prevent damage to pad 106 when creating the cavity, in practice, damage may be inevitable due to various factors, such as nature of the conductive material of pad 106, strength of the laser necessary to generate the cavity, number of passes needed to create the cavity, time available to generate the cavity, cavity depth, etc. Embodiments of microelectronic assembly using pad 106 as described herein can minimize and, in some cases, eliminate such damage to pad 106 from the laser skiving process.

Turning to FIG. 1B, which is a simplified perspective view of interposer 102 shown with IC dies 110 removed, bond pads 124 are on a surface of interposer 102 proximate to IC dies 110. In assembled form as in microelectronic assembly 100, FLIs 112 are in conductive contact with bond pads 124. Bond pads 124 may have differing pitches for different types and sizes of FLIs 112. For example, certain FLIs 112 coupling with bridge die 114 may have a smaller pitch (e.g., 30 micrometers-55 micrometers pitch) between adjacent interconnects as compared to other FLIs 112 (e.g., greater than 50 micrometers pitch) coupled to vias 122 through interposer 102. Note that although pad 106 with ceramic liner 108 is shown for bridge die 114, pad 106 with ceramic liner 108 may also be used for embedded passives such as capacitors and inductors, for example, to minimize parasitics and achieve smaller form factor for interposer 102.

FIG. 2 is a schematic cross-sectional view of another example microelectronic assembly 100 according to some embodiments of the present disclosure. One of IC dies 110 coupled to interposer 102 may comprise a photonic IC (PIC) 202. An integrated heat sink 204 may be coupled to IC dies 110 for suitable heat transfer performance as needed. PIC 202 may be coupled to an optical fiber 206 and an optical connector 208. Bridge die 114 in contact with pad 106 may enable IC die 110 to be conductively coupled to PIC 202. Pad 106 may comprise ceramic liner 108 as discussed in reference to FIGS. 1A and 1B, or pad 106 may comprise fin structures, as discussed in reference to FIG. 4.

Various other configurations and types of IC dies 110 on interposer 102 not specifically described herein are included within the broad scope of the embodiments. In various embodiments, any of the features discussed with reference to any of FIGS. 1-2 herein may be combined with any other features to form a package with one or more IC dies as described herein, for example, to form a modified microelectronic assembly 100. Some such combinations are described above, but, in various embodiments, further combinations and modifications are possible.

Example Methods

Figure 3A:
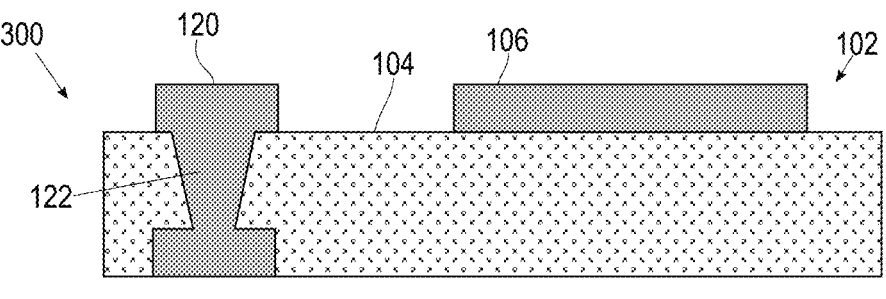

FIGS. 3A-3D are schematic cross-sectional views of various stages of manufacture of an example microelectronic assembly 100 having interposer 102 according to some embodiments of the present disclosure. FIG. 3A shows an assembly 300 subsequent to forming pad 106 over dielectric material 104. Assembly 300 may include multiple layers of dielectric material 104, although only one layer is shown for ease of illustration, and not as a limitation. The one or more layers of dielectric material 104, as also conductive traces 120 and conductive vias 122 may be fabricated using subtractive or additive processes as is known in the art. For example, assembly 300 may be formed using a semi-additive patterning (SAP) process, comprising lithography patterning of dry film photoresist (DFR) on dielectric material 104, followed by metal plating (e.g., such as copper) and resist strip to form various patterns of via landing pads, conductive traces, etc. as desired and based on particular needs. In a specific example, forming vias 122 may comprise forming through-holes in dielectric material 104, and depositing conductive material in the through-holes. In other embodiments, forming vias 122 may comprise forming conductive pillars at locations corresponding to vias 122, and depositing dielectric material 104 around the conductive pillars. For simplicity of discussion and ease of illustration, back-side patterning of interposer 102 is not shown in the figures; as will be appreciated by one of ordinary skill in the art, such patterning processes are typically mostly mirror images of the front side patterning as described herein.

Figure 3B:
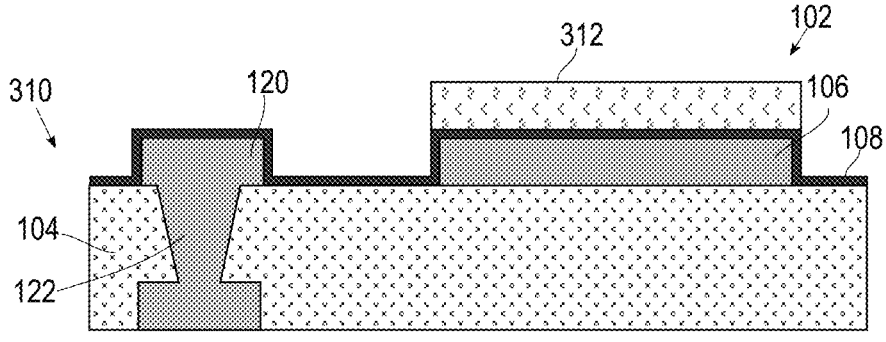

FIG. 3B shows an assembly 310 subsequent to depositing a conformal coating of ceramic liner 108 over a surface of assembly 300. In various embodiments, ceramic liner 108 may be between 10 nanometers and 20 nanometers thick; in other embodiments, ceramic liner 108 may be thicker than 20 nanometers depending on various performance requirements (e.g., to protect the metal pad during the laser skive process). In some embodiments, ceramic liner 108 may be deposited by a sputter deposition process. Ceramic liner 108 may include any type of material that may be sputter deposited and is resistant to laser ablation, such as silicon nitride, tantalum nitride, titanium oxide, titanium carbide, and titanium diboride. Once ceramic liner 108 is uniformly deposited across the surface of assembly 300, a DFR 312 may be laminated over ceramic liner 108 and then lithographically patterned to leave a portion of DFR 312 on pad 106, leaving other portions of ceramic liner 108 exposed. Assembly 310 is then subjected to subsequent etching of exposed ceramic liner 108, and then a resist strip process to remove DFR 312, thereby leaving only the portion of ceramic liner 108 on pad 106, while the rest of ceramic liner 108 is removed.

Figure 3C:
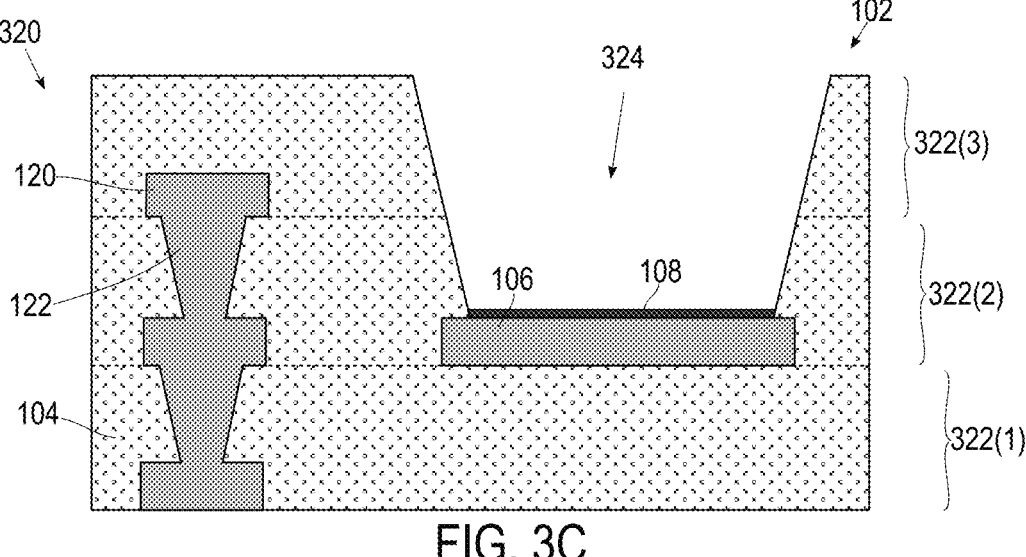

FIG. 3C shows an assembly 320 subsequent to further operations on assembly 310. SAP process may be carried out on assembly 310 to pattern additional layer(s) 322 as needed comprising dielectric material 104, conductive traces 120 and vias 122. In the example embodiment of the figure, three such layers 322 are shown, namely 322(1)-322(3). Any number of such layers 322 may be fabricated as desired based on particular needs. In some embodiments where dielectric material 104 is a dry film, the process may include dry film lamination, followed by laser drilling of vias, which is then followed by electroplating of copper (or other conductive material) corresponding to conductive traces 120 and vias 122. After the desired number of layers 322 is obtained, laser skiving is performed to open a cavity 324 corresponding to the location of bridge die 114. During the laser skiving process, the laser beam is in direct interaction with ceramic liner 108 and not the conductive material of pad 106. Ceramic liner 108, being resistant to the laser ablation to a greater extent than the conductive material of pad 106, may prevent damage to pad 106.

FIG. 3D shows an assembly 330 subsequent to further operations on assembly 320. Bridge die 114 may be placed in cavity 324 such that surface 118 is in contact with ceramic liner 108. Any space around bridge die 114 may be filled up with dielectric material 104 as shown. In some embodiments (not shown), a material different from dielectric material 104 may be used around bridge die 114. An encapsulation layer of a solder resist material 332 may be deposited over topmost layer 322(3), and vias and bonding pads 124 may be formed to complete interposer 102.

Figure 4C:
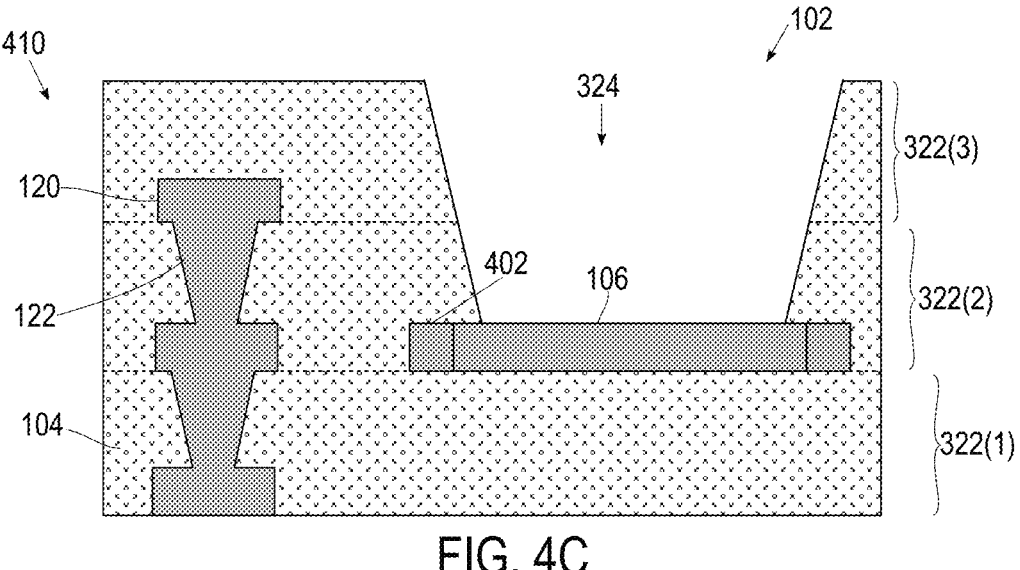

FIGS. 4A-4D are schematic cross-sectional views of various stages of manufacture of another example microelectronic assembly 100 having interposer 102 according to some embodiments of the present disclosure. FIG. 4A shows an assembly 400 subsequent to forming pad 106 over dielectric material 104. Assembly 400 may include multiple layers of dielectric material 104, although only one layer is shown for ease of illustration, and not as a limitation. The one or more layers of dielectric material 104, as also conductive traces 120 and conductive vias 122 may be fabricated using subtractive or additive processes as is known in the art. For example, assembly 400 may be formed using the SAP process, comprising lithography patterning of DFR on dielectric material 104, followed by metal plating (e.g., such as copper) and resist strip to form various patterns of via landing pads, conductive traces, etc. as desired and based on particular needs. In a specific example, forming vias 122 may comprise forming through-holes in dielectric material 104, and depositing conductive material in the through-holes. In other embodiments, forming vias 122 may comprise forming conductive pillars at locations corresponding to vias 122, and depositing dielectric material 104 around the conductive pillars. For simplicity of discussion and ease of illustration, back-side patterning of interposer 102 is not shown in the figures; as will be appreciated by one of ordinary skill in the art, such patterning processes are typically mostly mirror images of the front side patterning as described herein. In particular, pad 106 may be patterned to have fin structures 402 along peripheral edges of pad 106.

A top view of the structure of FIG. 4A along plane BB' is shown in FIG. 4B. It may be noted that a cross-section taken along axis AA' is the view shown in FIG. 4A. In the example embodiment shown in FIG. 4B, fin structures 402 may comprise regular rectangular shapes. In other embodiments, fin structures 402 may comprise other shapes, including irregular shapes that can provide more surface area for higher thermal conduction than a pad shape with plain and smooth edges. In some embodiments, shapes of fin structures 402 may be configured to prevent delamination of pad 106 due to various reasons, such as uneven thermal dissipation and/or energy absorption during the laser skiving process. The particular shape and dimensions (e.g., length, width, spacing, etc.) of fin structures 402 may be configured in various embodiments according to cooling efficiency and space availability taking also into consideration any electrical characteristics required of pad 106, such as impedance characteristics in the presence of high-speed signals through conductive traces 120 and vias 122.

FIG. 4C shows an assembly 410 subsequent to further operations on assembly 400. In the next step, SAP process may be carried out to pattern additional layer(s) 322 as needed comprising dielectric material 104, conductive traces 120 and vias 122. In the example embodiment of the figure, three such layers 322 are shown, namely 322(1)-322(3). Any number of such layers 322 may be fabricated as desired based on particular needs. In some embodiments where dielectric material 104 is a dry film, the process may include dry film lamination, followed by laser drilling of vias, which is then followed by electroplating copper (or other conductive material) of conductive traces 120 and vias 122. After the desired number of layers 322 is obtained, laser skiving is performed to open cavity 324 corresponding to the location of bridge die 114. In various embodiments, fin structures 402 may extend beyond the edges of cavity 324 so as to be anchored in and surrounded by dielectric material 104. As a result, fin structures 402 may extend beyond a footprint of bridge die 114 placed inside cavity 324, as shown more clearly in FIG. 4D.

Figure 4D:
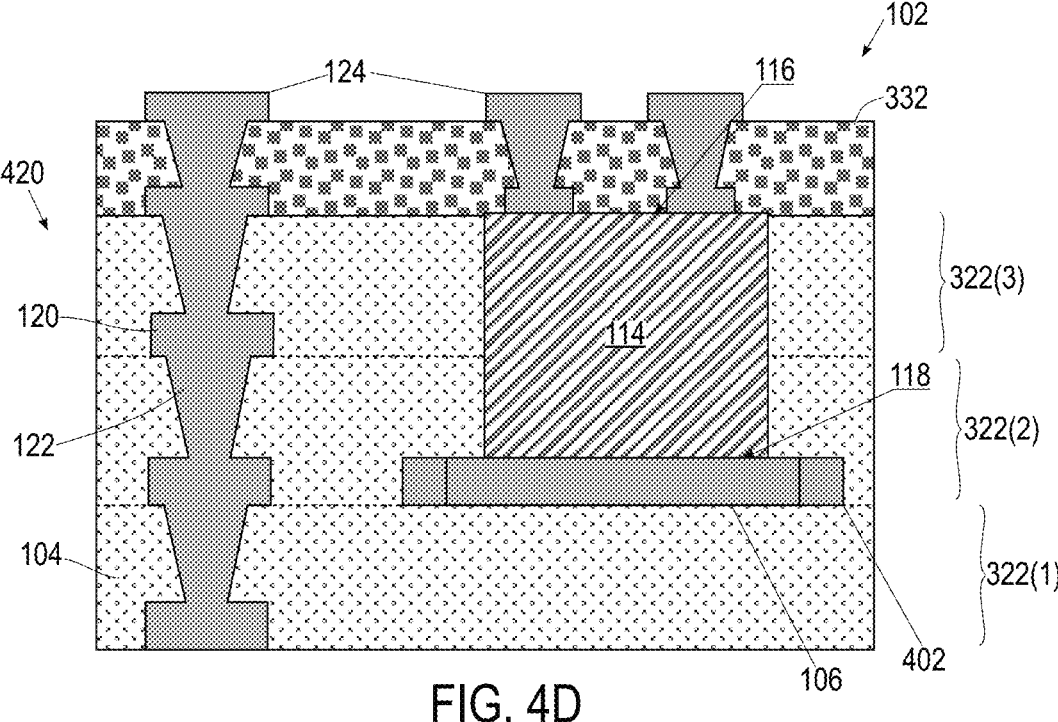

FIG. 4D shows an assembly 420 subsequent to further operations on assembly 410. Bridge die 114 may be placed in cavity 324 such that surface 118 is in contact with the conductive material of pad 106. Any space around bridge die 114 may be filled up with dielectric material 104 as shown. In some embodiments (not shown), a material different from dielectric material 104 may be used around bridge die 114. An encapsulation layer of solder resist material 332 may be deposited over topmost layer 322(3), and vias and bonding pads 124 may be formed to complete interposer 102.

Although FIGS. 3-4 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIGS. 3-4 may be modified in accordance with the present disclosure to fabricate others of microelectronic package 100 disclosed herein. Although the operations are illustrated in FIGS. 3-4 once each, the operations may be repeated as often as desired. For example, one or more operations may be performed in parallel to manufacture multiple microelectronic packages substantially simultaneously. In another example, the operations may be performed in a different order to reflect the structure of a particular microelectronic package 100 as described herein.

Furthermore, the operations illustrated in FIGS. 3-4 may be combined or may include more details than described. Still further, the operations as described may further include other manufacturing operations related to fabrication of other components of the microelectronic assemblies described herein, or any devices that may include the microelectronic assemblies as described herein. For example, the operations may include various cleaning operations, surface planarization operations (e.g., using chemical mechanical polishing (CMP)), operations for surface roughening, operations to include barrier and/or adhesion layers as desired, and/or operations (e.g., solder reflow, epoxy curing, etc.) for incorporating microelectronic packages as described herein in, or with, an IC component, a computing device, or any desired structure or device.

Example Devices and Components

Figure 5:
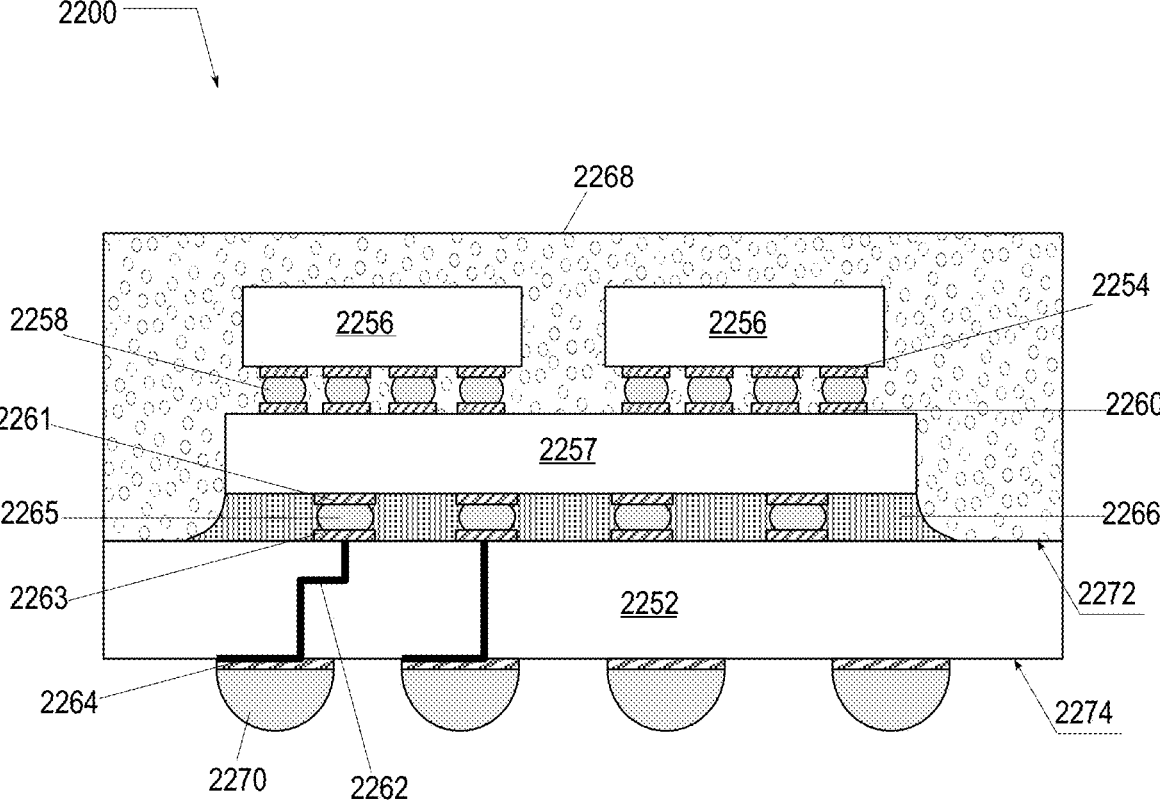
FIG. 5 is a cross-sectional view of a device package that includes one or more microelectronic assemblies in accordance with any of the embodiments disclosed herein.
Figure 6:
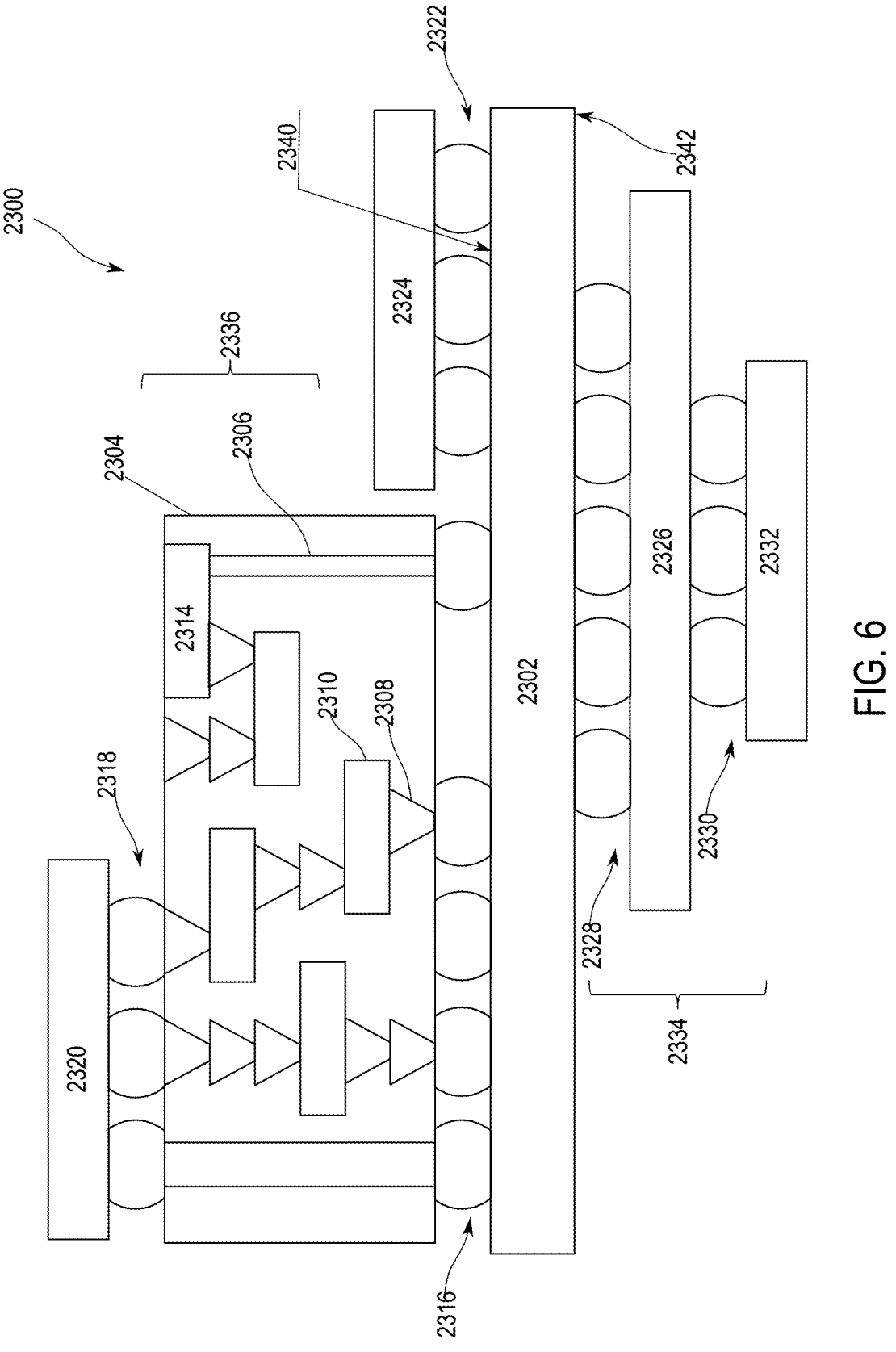
FIG. 6 is a cross-sectional side view of a device assembly that includes one or more microelectronic assemblies in accordance with any of the embodiments disclosed herein.
Figure 7:
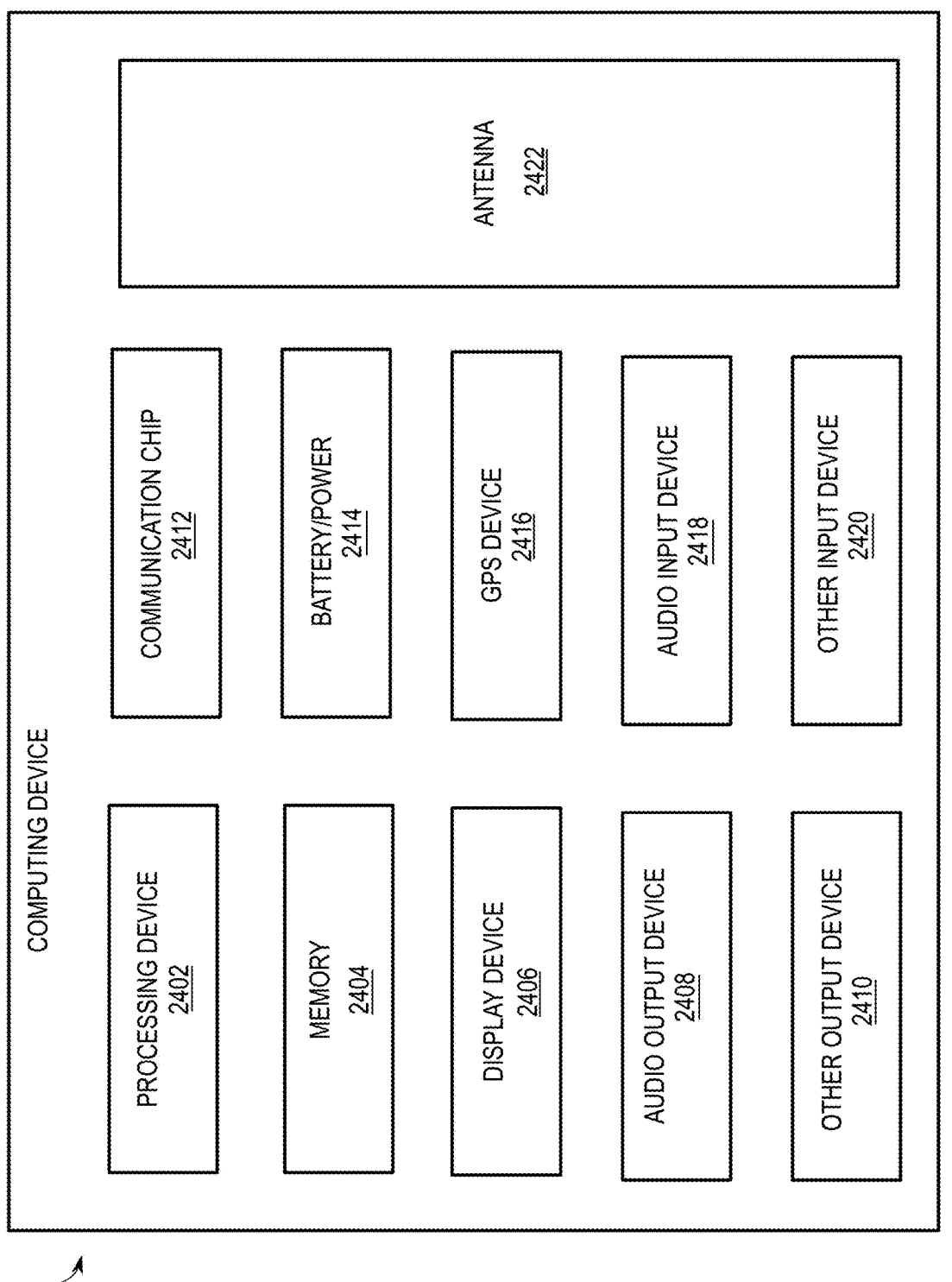
FIG. 7 is a block diagram of an example computing device that includes one or more microelectronic assemblies in accordance with any of the embodiments disclosed herein.

The packages disclosed herein, e.g., any of the embodiments shown in FIGS. 1-4 or any further embodiments described herein, may be included in any suitable electronic component. FIGS. 5-7 illustrate various examples of packages, assemblies, and devices that may be used with or include any of the IC packages as disclosed herein.

FIG. 5 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 6.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 6 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 5.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 5. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 7 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 5). In yet another example, any one or more of the components of computing device 2400 may include an IC device assembly 2300 (e.g., as shown in FIG. 6).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache-memory and may include embedded-DRAM (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100), comprising (e.g., FIGS. 1A, 1B): an interposer (e.g., 102) comprising a dielectric material (e.g., 104) and a pad (e.g., 106) of conductive material having at least one of a ceramic liner (e.g., 108) and fin structures (e.g., 402); at least two IC dies (e.g., 110(1), 110(2)) coupled to the interposer; and a bridge die (e.g., 114) in the interposer conductively coupled to the at least two IC dies, in which: the bridge die has a first face (e.g., 116) and an opposing second face (e.g., 118), the first face of the bridge die is proximate to the at least two IC dies, and the second face of the bridge die is in contact with the pad.

Example 2 provides the microelectronic assembly of example 1, in which the ceramic liner comprises at least one of: a compound comprising silicon and nitrogen, a compound comprising tantalum and nitrogen, a compound comprising titanium and at least one of oxygen, carbon, and boron.

Example 3 provides the microelectronic assembly of example 1, in which (e.g., FIG. 4) the fin structures are on peripheral edges of the pad.

Example 4 provides the microelectronic assembly of example 3, in which the fin structures extend beyond a footprint of the bridge die.

Example 5 provides the microelectronic assembly of any one of examples 3-4, in which the fin structures are rectangular shaped.

Example 6 provides the microelectronic assembly of any one of examples 3-4, in which the fin structures are irregular shaped.

Example 7 provides the microelectronic assembly of any one of examples 1-6, in which: the pad has a first footprint, the bridge die has a second footprint, the first footprint is larger than the second footprint.

Example 8 provides the microelectronic assembly of any one of examples 1-7, in which the interposer further comprises conductive traces (e.g., 120) and vias (e.g., 122) in the dielectric material.

Example 9 provides the microelectronic assembly of any one of examples 1-8, in which the dielectric material comprises mold compound.

Example 10 provides the microelectronic assembly of any one of examples 1-9, in which the interposer comprises bond pads (e.g., 124) on a face proximate to the at least two IC dies.

Example 11 provides the microelectronic assembly of any one of examples 1-10, in which the at least two IC dies are coupled to the interposer by first-level interconnects (e.g., 112).

Example 12 provides the microelectronic assembly of example 11, in which a conductive pathway through the bridge die and the first-level interconnects conductively couples the at least two IC dies with each other.

Example 13 provides the microelectronic assembly of any one of examples 1-12, in which (e.g., FIG. 2) one of the at least two IC dies is a photonic IC die (PIC).

Example 14 provides the microelectronic assembly of example 13, in which the PIC is coupled to an optical fiber.

Example 15 provides the microelectronic assembly of any one of examples 1-14, further comprising a heat sink attached to the at least two IC dies.

Example 16 provides an interposer (e.g., 102), comprising: a dielectric material (e.g., 104) with conductive traces and vias therethrough; a bridge die having a first face (e.g., 116) and an opposing second face (e.g., 118); and a pad (e.g., 106) comprising a conductive material and having at least one of a ceramic liner (e.g., 108) and fin structures (e.g., 402), in which: the first face of the bridge die is proximate to an exterior surface of the interposer, and the second face of the bridge die is in contact with the pad.

Example 17 provides the interposer of example 16, further comprising a solder resist material (e.g., 332) on the exterior surface of the interposer.

Example 18 provides the interposer of any one of examples 16-17, in which the ceramic liner is between the second face of the bridge die and the conductive material of the pad.

Example 19 provides the interposer of any one of examples 16-18, in which a footprint of the pad is larger than another footprint of the bridge die.

Example 20 provides the interposer of any one of examples 16-19, in which (e.g., FIG. 4): the bridge die is in a cavity (e.g., 322), the pad is at a bottom of the cavity, and the fin structures extend beyond the cavity into the dielectric material.

Example 21 provides the interposer of any one of examples 16-20, in which the conductive material of the pad comprises copper.

Example 22 provides the interposer of any one of examples 16-21, in which the ceramic liner comprises at least one of: a compound comprising silicon and nitrogen, a compound comprising tantalum and nitrogen, a compound comprising titanium and at least one of oxygen, carbon, and boron.

Example 23 provides the interposer of any one of examples 16-22, in which the dielectric material comprises mold compound.

Example 24 provides the interposer of any one of examples 16-23, in which the conductive traces comprise bond pads on the exterior surface of the die.

Example 25 provides the interposer of any one of examples 16-24, in which the dielectric material comprises a plurality of layers of the dielectric material.

Example 26 provides a method of fabricating an interposer, the method comprising (e.g., FIGS. 3, 4): providing an interposer having a layer of a dielectric material; depositing conductive material on the layer of the dielectric material; patterning a pad having a desired shape and composition in a first portion of the conductive material; patterning conductive traces in a second portion of the conductive material; removing a third portion of the conductive material, the third portion being different from the first portion and the second portion; depositing additional layers of the dielectric material and forming conductive traces and vias therethrough until a desired buildup of the interposer is obtained; forming a cavity over the pad by laser skiving, in which the desired shape and composition of the pad is configured to prevent damage to the pad from the laser skiving; attaching a bridge die to the pad inside the cavity; encapsulating the bridge die with the dielectric material; and forming an interface layer comprising solder resist material and first-level interconnects.

Example 27 provides the method of example 26, in which the laser is a carbon dioxide laser with a wavelength greater than 10000 nanometers.

Example 28 provides the method of any one of examples 26-27, in which patterning the pad comprises: using photolithography to pattern a portion of the conductive material into a desired shape of the pad; depositing a layer of ceramic liner over exposed surfaces of the pad, the conductive traces and the dielectric material, in which a first portion of the ceramic liner is on the pad and a second portion of the ceramic liner is not on the pad; and removing the second portion of the ceramic liner on surfaces other than on the pad.

Example 29 provides the method of example 28, in which the ceramic liner is deposited using sputter deposition.

Example 30 provides the method of any one of examples 28-29, in which the ceramic liner is resistant to laser ablation.

Example 31 provides the method of any one of examples 28-30, in which the ceramic liner comprises at least one of: a compound comprising silicon and nitrogen, a compound comprising tantalum and nitrogen, a compound comprising titanium and at least one of oxygen, carbon, and boron.

Example 32 provides the method of any one of examples 28-31, in which removing the second portion of the ceramic liner comprises: covering the first portion of the ceramic liner with an etch-resistant material; etching the second portion of the ceramic liner; and removing the etch-resistant material.

Example 33 provides the method of example 32, in which the etch-resistant material is a dry film photoresist material.

Example 34 provides the method of example 26, in which the desired shape comprises a rectangle with fin structures along a periphery of the rectangle.

Example 35 provides the method of any one of examples 26-34, in which depositing additional layers of the dielectric material comprises laminating dry films comprising the dielectric material.

Example 36 provides the method of any one of examples 26-35, further comprising forming vias in the dielectric material.

Example 37 provides the method of example 36, in which forming the vias comprises: forming through-holes in the additional layers of the dielectric material; and depositing the conductive material in the through-holes.

Example 38 provides the method of example 36, in which forming the vias comprises: forming conductive pillars at locations corresponding to the vias; and depositing the additional layers of the dielectric material around the conductive pillars.

Example 39 provides the method of any one of examples 26-38, in which forming the interface layer comprises: depositing solder resist over the bridge die and the dielectric material; forming holes in the solder resist corresponding to bond pad locations; electroplating the holes with conductive material; and depositing conductive material corresponding to bond pads on a surface of the solder resist.

Example 40 provides the method of any one of examples 26-39, in which the conductive material comprises copper.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
an interposer comprising a dielectric material and a pad of conductive material having at least one of a ceramic liner and fin structures;
at least two integrated circuit (IC) dies coupled to the interposer; and
a bridge die in the interposer conductively coupled to the at least two IC dies,
wherein:
the bridge die has a first face and an opposing second face,
the first face of the bridge die is proximate to the at least two IC dies, and
the second face of the bridge die is in contact with the pad.

2. The microelectronic assembly of claim 1, wherein the ceramic liner comprises at least one of: a compound comprising silicon and nitrogen, a compound comprising tantalum and nitrogen, a compound comprising titanium and at least one of oxygen, carbon, and boron.

3. The microelectronic assembly of claim 1, wherein the fin structures are on peripheral edges of the pad.

4. The microelectronic assembly of claim 3, wherein the fin structures extend beyond a footprint of the bridge die.

5. The microelectronic assembly of claim 3, wherein the fin structures are rectangular shaped.

6. The microelectronic assembly of claim 1, wherein:
the pad has a first footprint, the bridge die has a second footprint, and
the first footprint is larger than the second footprint.

7. The microelectronic assembly of claim 1, wherein the interposer further comprises conductive traces and vias in the dielectric material.

8. The microelectronic assembly of claim 1, wherein the dielectric material comprises mold compound.

9. The microelectronic assembly of claim 1, wherein the at least two IC dies are coupled to the interposer by first-level interconnects.

10. An interposer, comprising:
a dielectric material with conductive traces and vias therethrough;
a bridge die having a first face and an opposing second face; and
a pad comprising a conductive material and having at least one of a ceramic liner and fin structures,
wherein:
the first face of the bridge die is proximate to an exterior surface of the interposer, and
the second face of the bridge die is in contact with the pad.

11. The interposer of claim 10, wherein the ceramic liner is between the second face of the bridge die and the conductive material of the pad.

12. The interposer of claim 10, wherein:
the bridge die is in a cavity,
the pad is at a bottom of the cavity, and
the fin structures extend beyond the cavity into the dielectric material.

13. The interposer of claim 10, wherein the ceramic liner comprises at least one of: a compound comprising silicon and nitrogen, a compound comprising tantalum and nitrogen, a compound comprising titanium and at least one of oxygen, carbon, and boron.

14. The interposer of claim 10, wherein the dielectric material comprises mold compound.

15. The interposer of claim 10, wherein the dielectric material comprises a plurality of layers of the dielectric material.

16. A method of fabricating an interposer, the method comprising:
providing an interposer having a layer of a dielectric material;
depositing conductive material on the layer of the dielectric material;
patterning a pad having a desired shape and composition in a first portion of the conductive material;
patterning conductive traces in a second portion of the conductive material;
removing a third portion of the conductive material, the third portion being different from the first portion and the second portion;
depositing additional layers of the dielectric material and forming conductive traces and vias therethrough until a desired buildup of the interposer is obtained;
forming a cavity over the pad by laser skiving, wherein the desired shape and composition of the pad is configured to prevent damage to the pad from the laser skiving;
attaching a bridge die to the pad inside the cavity;
encapsulating the bridge die with the dielectric material; and
forming an interface layer comprising solder resist material and first-level interconnects.

17. The method of claim 16, wherein patterning the pad comprises:

using photolithography to pattern a portion of the conductive material into a desired shape of the pad;

depositing a layer of ceramic liner over exposed surfaces of the pad, the conductive traces and the dielectric material, wherein a first portion of the ceramic liner is on the pad and a second portion of the ceramic liner is not on the pad; and removing the second portion of the ceramic liner on surfaces other than on the pad.

18. The method of claim 17, wherein the ceramic liner comprises at least one of: a compound comprising silicon and nitrogen, a compound comprising tantalum and nitrogen, a compound comprising titanium and at least one of oxygen, carbon, and boron.

19. The method of claim 17, wherein removing the second portion of the ceramic liner comprises:

covering the first portion of the ceramic liner with an etch-resistant material;

etching the second portion of the ceramic liner; and removing the etch-resistant material.

20. The method of claim 16, wherein the desired shape comprises a rectangle with fin structures along a periphery of the rectangle.

* * * * *